United States Patent
Wu et al.

(10) Patent No.: US 12,113,100 B2
(45) Date of Patent: Oct. 8, 2024

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Hongmin Wu, Hefei (CN); Yu-Sheng Ting, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 486 days.

(21) Appl. No.: 17/509,152

(22) Filed: Oct. 25, 2021

(65) Prior Publication Data

US 2022/0238637 A1 Jul. 28, 2022

Related U.S. Application Data

(63) Continuation of application No. PCT/CN2021/108173, filed on Jul. 23, 2021.

(30) Foreign Application Priority Data

Jan. 28, 2021 (CN) .......................... 202110117220.2

(51) Int. Cl.
  *H01L 29/94* (2006.01)
  *H01L 49/02* (2006.01)

(52) U.S. Cl.
  CPC .............. *H01L 28/75* (2013.01); *H01L 28/92* (2013.01); *H01L 29/945* (2013.01)

(58) Field of Classification Search
  CPC ......... H01L 28/75; H01L 28/90; H01L 28/86; H01L 28/945; H10B 12/00; H10B 12/03; H10B 12/033; H10B 12/0335; H10B 12/30; H10B 12/31
  See application file for complete search history.

(56) References Cited

U.S. PATENT DOCUMENTS

| | | | |
|---|---|---|---|
| 7,919,385 B2 | 4/2011 | Nakamura | |
| 11,271,073 B2* | 3/2022 | Kim | ........................ H10B 12/30 |
| 2008/0029801 A1 | 2/2008 | Nakamura | |
| 2009/0170272 A1 | 7/2009 | Nakamura | |
| 2020/0098853 A1* | 3/2020 | Haraguchi | .............. H01L 28/91 |
| 2022/0068930 A1* | 3/2022 | Peng | .................... H10B 12/033 |

FOREIGN PATENT DOCUMENTS

| | | |
|---|---|---|
| CN | 107968044 A | 4/2018 |
| CN | 208819882 U | 5/2019 |
| CN | 112909169 A | 6/2021 |

* cited by examiner

*Primary Examiner* — Jose R Diaz

(74) *Attorney, Agent, or Firm* — Kilpatrick Townsend & Stockton LLP

(57) ABSTRACT

Provided are a semiconductor structure and a method for manufacturing the semiconductor structure. The semiconductor structure includes a substrate in which a capacitor structure is formed, and the capacitor structure includes a lower electrode plate, a dielectric layer, an upper electrode plate and a protective layer. The lower electrode plate is located on the substrate. The dielectric layer covers a surface of the lower electrode plate. The upper electrode plate covers the dielectric layer. The protective layer is formed on a surface of the upper electrode plate parallel to the substrate.

18 Claims, 9 Drawing Sheets

SEMICONDUCTOR STRUCTURE AND METHOD FOR MANUFACTURING SEMICONDUCTOR STRUCTURE

CROSS-REFERENCE TO RELATED APPLICATIONS

This is a continuation application of International Patent Application No. PCT/CN2021/108173, filed on Jul. 23, 2021, which claims priority to Chinese patent application No. 202110117220.2, filed on Jan. 28, 2021 and entitled "SEMICONDUCTOR STRUCTURE AND METHOD FOR MANUFACTURING SEMICONDUCTOR STRUCTURE". The disclosure of International Patent Application No. PCT/CN2021/108173 and Chinese patent application No. 202110117220.2 are hereby incorporated by reference in their entities.

BACKGROUND

In the related art, a capacitor structure and a plug formed in a semiconductor structure have a relatively large contact resistance between the formed plug and the capacitor structure due to the limitation of the capacitor structure itself, which affects the service performance of the semiconductor structure.

SUMMARY

The present disclosure relates to the technical field of semiconductors, and in particular, to a semiconductor structure and a method for manufacturing the semiconductor structure.

The present disclosure provides a semiconductor structure and a method for manufacturing the semiconductor structure, so as to improve the performance of the semiconductor structure.

According to a first aspect of the present disclosure, a semiconductor structure is provided. The semiconductor structure includes a substrate in which a capacitor structure is formed, and the capacitor structure includes a lower electrode plate, a dielectric layer, an upper electrode plate and a protective layer.

The lower electrode plate is located on the substrate.

The dielectric layer covers a surface of the lower electrode plate.

The upper electrode plate covers the dielectric layer.

The protective layer is formed on a surface, parallel to the substrate, of the upper electrode plate.

According to a second aspect of the present disclosure, a method for manufacturing a semiconductor structure is provided, which includes the following operations. A substrate is provided, and a capacitor structure is formed in the substrate. The operation of forming the capacitor structure includes the following steps.

A lower electrode plate is formed on the substrate.

A dielectric layer is formed on a surface of the lower electrode plate.

An upper electrode plate is formed on a surface of the dielectric layer.

A protective layer is formed on a surface, parallel to the substrate, of the upper electrode plate.

BRIEF DESCRIPTION OF THE DRAWINGS

By considering the following detailed descriptions of preferred embodiments of the present disclosure in combination with the drawings, various objects, features and advantages of the present disclosure may become more apparent. The drawings are merely exemplary illustrations of the present disclosure and are not necessarily drawn to scale. In the drawings, the same reference numerals always refer to the same or similar components. In the drawings.

DETAILED DESCRIPTION

Figure 1:
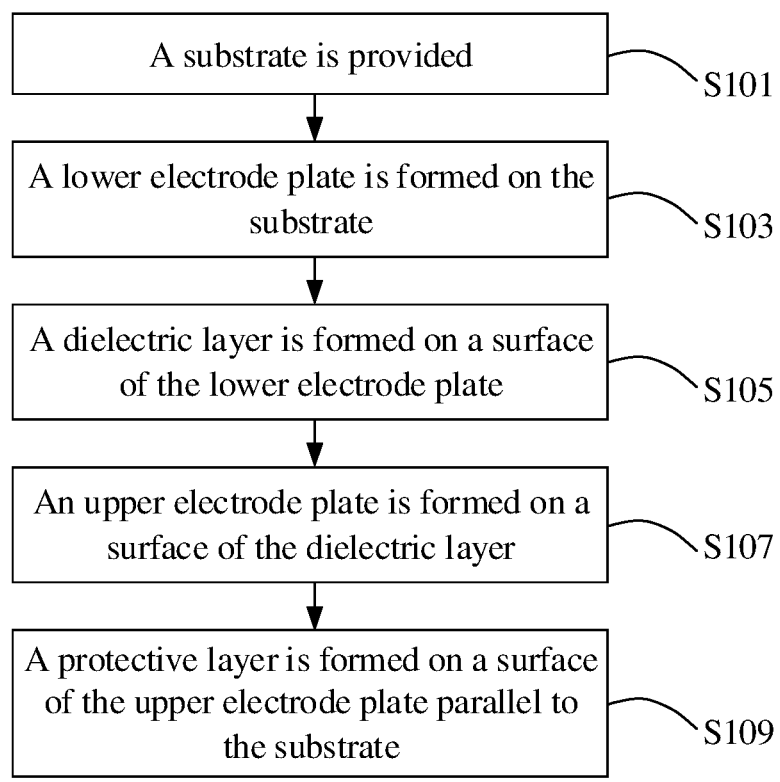
FIG. 1 is a flow schematic diagram of a method for manufacturing a semiconductor structure shown according to an exemplary embodiment.

Typical embodiments embodying the features and advantages of the present disclosure will be described in detail in the following descriptions. It should be understood that the present disclosure may have various variations in the different embodiments without departing from the scope of the present disclosure, and the descriptions and drawings therein are intended to be illustrative in nature rather than limiting the present disclosure.

In the following description of the different exemplary embodiments of the present disclosure, it is implemented with reference to the drawings, the drawings form a part of the present disclosure, and therein different exemplary structures, systems and steps that may implement various aspects of the present disclosure are shown by way of example. It should be understood that other specific schemes of components, structures, exemplary devices, systems and steps may be used, and structural and functional modifications may be made without departing from the scope of the present disclosure. Moreover, although terms "above", "between", "within" and the like may be used in the present specification to describe the different exemplary features and elements of the present disclosure, these terms are used herein for convenience only, for example, according to the directions of the examples in the drawings. Any content in the present specification should not be understood as requiring a specific three-dimensional direction of the structure to fall within the scope of the present disclosure.

An embodiment of the present disclosure provides a method for manufacturing a semiconductor structure. Referring to FIG. 1, the method includes the following operations.

In S101, a substrate 10 is provided.

In S103, a lower electrode plate 20 is formed on the substrate 10.

In S105, a dielectric layer 30 is formed on a surface of the lower electrode plate 20.

In S107, an upper electrode plate is formed on a surface of the dielectric layer 30.

In S109, a protective layer 60 is formed on a surface of the upper electrode plate parallel to the substrate 10.

With the method for manufacturing the semiconductor structure according to an embodiment of the present disclosure, a capacitor structure is formed through sequentially forming the lower electrode plate 20, the dielectric layer 30, the upper electrode plate and the protective layer 60 on the substrate 10. The protective layer 60 formed on the upper surface of the upper electrode plate may improve the resistance performance of the capacitor structure, thereby improving the service performance of the semiconductor structure.

It should be noted that the lower electrode plate 20, the dielectric layer 30, the upper electrode plate and the protective layer 60 in the present embodiment form the capacitor structure. When a contact hole (i.e., a plug 91) is formed to be connected with the capacitor structure subsequently, a contact resistance between the contact hole and the capacitor structure may be reduced due to the arrangement of the protective layer 60.

Figure 2:
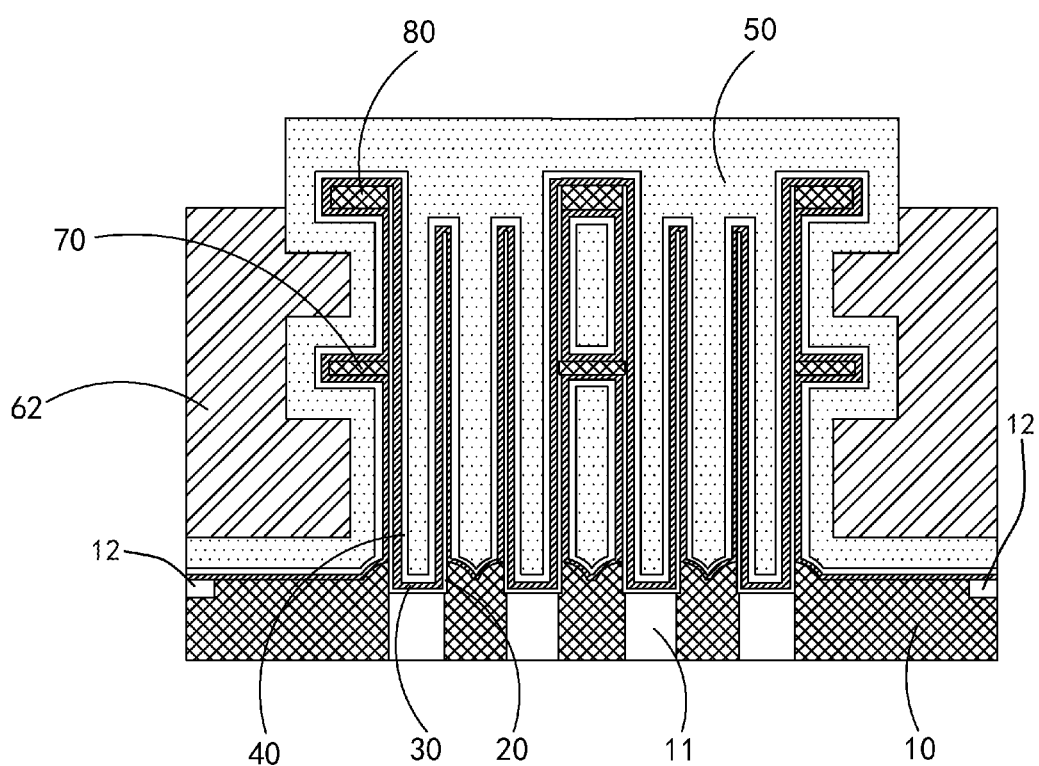
FIG. 2 is a structure schematic diagram in which a spin-coated carbon layer is formed by a method for manufacturing a semiconductor structure shown according to an exemplary embodiment.

In some embodiments, before the capacitor structure is formed, a contact pad 11 in an array area and a contact portion 12 in a peripheral area are formed, and the contact pad 11 and the contact portion 12 may refer to the structure shown in FIG. 2.

In a process of forming the capacitor structure, a laminated structure is formed above the substrate 10, and the laminated structure includes a first support layer 70, a second support layer 80, and a sacrificial layer located between the first support layer 70 and the second support layer 80, and between the first support layer 70 and the substrate 10. After multiple capacitor holes are formed on the laminated structure and the contact pad 11 in the substrate 10 is exposed, the lower electrode plate 20 is formed in the capacitor holes, and the lower electrode plate 20 directly contacts with the contact pad 11. Then, the sacrificial layer is removed, thus the lower electrode plate 20 is supported by the first support layer 70 and the second support layer 80.

The surface of the lower electrode plate 20 is covered with the dielectric layer 30. At this time, the dielectric layer 30 may cover the contact portion 12 in the peripheral area. After the surface of the dielectric layer 30 is covered with the upper electrode plate, the upper side of the contact portion 12 in the peripheral area may also be covered with the upper electrode plate (including an upper electrode 40 and an upper electrode filling layer 50), as shown in FIG. 2. Therefore, after the capacitor structure is formed, it is necessary to cut off an excess material covering the contact portion 12 in the peripheral area to expose the contact portion 12 in the peripheral area, so as to facilitate the plug 91 to be connected with the contact portion 12 when the plug 91 is subsequently formed.

In an embodiment, the protective layer 60 includes metal silicide.

In an embodiment, a process of forming the capacitor structure further includes the following operations. The upper electrode plate located outside a side wall of the protective layer 60 is removed downwards along the side wall of the protective layer 60, that is, the protective layer 60 is used as a mask for etching downwards, so that the side wall of the protective layer 60 may be flush with a side wall, with a largest cross-sectional area, of the upper electrode plate, that is, it is guaranteed by arranging the protective layer 60 that when the excess electrode material above the substrate 10 is etched, there is no problem that the electrode material on one side is not etched normally due to an offset of a photoetching pattern, but in contact with the plug 91 in the peripheral area to cause a short circuit.

In an embodiment, the upper electrode plate includes the upper electrode 40 and the upper electrode filling layer 50. The upper electrode 40 is formed on the surface of the dielectric layer 30, the upper electrode filling layer 50 is formed on a surface of the upper electrode 40, and the protective layer 60 is formed on the upper electrode filling layer 50.

It should be noted that after the capacitor structure is formed, the plug 91 formed in the peripheral area needs to be connected with the contact portion 12, that is, it is necessary to guarantee that the contact portion 12 is exposed to prevent the plug 91 from directly contacting with the upper electrode filling layer 50, so as to avoid the short circuit. After the capacitor structure is formed, if the bottom of the upper electrode filling layer 50 is removed by using an upper side wall of the capacitor structure as a standard, it may be guaranteed that removal lengths of opposite sides of the bottom of the upper electrode filling layer 50 are consistent, that is, a problem that one side is too long may not occur. Since the protective layer 60 is used as a mask for etching, the problem that the electrode material on one side is not normally etched due to the offset of the photoetching pattern, but in contact with the plug 91 in the peripheral area to cause the short circuit may not occur. Therefore, by forming the protective layer 60 on the upper surface of the upper electrode filling layer 50 and removing the portion of the upper electrode filling layer 50 covering the contact portion 12 downwards along the side wall of the protective layer 60, it is possible to guarantee that the removal lengths of the opposite sides of the bottom of the upper electrode filling layer 50 are consistent, that is, the contact portion 12 in the peripheral area is exposed.

It should be noted that the upper electrode filling layer 50 located in the peripheral area is removed downwards along the side wall of the protective layer 60, that is, an inner side of the side wall is used as a cutting standard, the upper electrode filling layer 50 located on the inner side of the side wall is retained, while the upper electrode filling layer 50 located outside the inner side of the side wall is removed, and finally the contact portion 12 is exposed.

The side wall, with the largest cross-sectional area, of the upper electrode filling layer 50 is a cross section formed by cutting the upper electrode filling layer 50 in a direction parallel to the substrate 10. The side wall of the protective layer 60 is flush with the side wall, with the largest cross-sectional area, of the upper electrode filling layer 50, that is, the side wall of the protective layer 60 is coincided with a vertical projection of the side wall, with the largest cross-sectional area, of the upper electrode filling layer 50 on the substrate 10. The side wall herein refers specifically to an outer side wall. Therefore, it may be further understood that a circumferential outer edge of the protective layer 60 is coincided with a vertical projection of a circumferential outer edge, with the largest cross-sectional area, of the upper electrode filling layer 50 on the substrate 10.

In an embodiment, the side wall of the protective layer 60 is flush with an circumferential outer edge of the upper surface of the upper electrode filling layer 50, so as to guarantee that the upper electrode filling layer 50 located outside the side wall is removed downwards along the side wall of the protective layer 60, that is, the upper electrode filling layer 50 located outside the circumferential outer edge of the upper surface of the upper electrode filling layer 50 is removed downwards along the circumferential outer edge of the upper surface of the upper electrode filling layer 50.

In an embodiment, the substrate 10 may include a silicon nitride layer, and the capacitor structure is directly arranged on the silicon nitride layer.

In an embodiment, the substrate 10 may further include a portion formed by a silicon-containing material. The substrate 10 may be formed by any suitable materials, which includes, for example, at least one of silicon, monocrystalline silicon, polycrystalline silicon, amorphous silicon, silicon germanium, monocrystalline silicon germanium, polycrystalline silicon germanium or carbon-doped silicon.

It should be noted that the forming processes of the lower electrode plate 20, the dielectric layer 30, the upper electrode 40 and the upper electrode filling layer 50 may be a physical vapor deposition process, a chemical vapor deposition process, an atomic layer deposition process and the like in the related art, and is not limited herein.

The material of the lower electrode plate 20 includes, but is not limited to, titanium nitride.

The material of the dielectric layer 30 includes a high-k material. The high-k material includes, but is not limited to, at least one of aluminum oxide, zirconium oxide or hafnium oxide.

The material of the upper electrode 40 includes, but is not limited to, titanium nitride.

The material of the upper electrode filling layer 50 includes, but is not limited to, polysilicon.

In an embodiment, the method for manufacturing the semiconductor structure further includes the following operations. The upper electrode 40 and the dielectric layer 30 under the upper electrode filling layer 50 located outside the side wall are removed downwards along the side wall of the protective layer 60, that is, the upper electrode 40 and the dielectric layer 30 under the bottom of the upper electrode filling layer 50 are also removed to expose the substrate 10.

It should be noted that an upper side of the substrate 10 is directly covered with the dielectric layer 30. Correspondingly, an upper side of the dielectric layer 30 is directly covered with the upper electrode 40, and an upper side of the upper electrode 40 is directly covered with the upper electrode filling layer 50. Therefore, when the portions located outside the side wall are removed downwards along the side wall of the protective layer 60, the upper electrode filling layer 50, the upper electrode 40 and the dielectric layer 30 located on the substrate 10 are removed at the same time, thereby the upper side of the substrate 10 is exposed.

In an embodiment, a doping element reacts with the upper electrode plate to generate the protective layer 60.

Specifically, the upper electrode plate includes polysilicon, the doping element is a metal element, and the doping element includes at least one of nickel, cobalt, titanium, copper, molybdenum, tantalum or tungsten. It should be noted that a high-temperature refractory metal, a transition metal, a precious metal or a rare earth metal may all be used as the doping element.

In the related art, cutting off the material in the peripheral area is achieved by photoetching, thereby exposing the contact portion 12 in the peripheral area. However, once a photoresist is offset, a pattern may be caused to be offset, and the electrode material of the contact portion 12 in the peripheral area is not effectively cut off, thereby causing a contact short circuit between the electrode material in the array area and the contact portion 12 in the peripheral area.

In the present embodiment, there is no photoetching process, which avoids a problem of the photoresist offset. At the same time, compared with a general etching process, the protective layer 60 of the present embodiment is generated by a reaction of the doping element with the upper electrode plate, that is, the metal silicide generated by the reaction has a good etching selection ratio to the electrode material, the photoetching process is avoided, thereby avoiding a problem that the electrode material of the contact portion 12 in the peripheral area is not effectively cut off.

In an embodiment, a process of generating the protective layer 60 includes the following operations. Ion doping is performed on the outer surface of the upper electrode plate and then annealing is performed on the doped outer surface to generate the protective layer 60. The doping element may be implanted into the upper electrode plate by ion implantation, so that metal ions react with the polysilicon in the protective layer 60 to generate the metal silicide.

In an embodiment, the process of generating the protective layer 60 includes the following operations. A metal material layer 61 is formed on the upper electrode plate. The metal material layer 61 is enabled to react with the upper electrode plate to generate the protective layer 60.

It should be noted that the material of the upper electrode filling layer 50 includes polysilicon, and the metal material layer 61 is formed on the upper electrode filling layer 50. The metal material layer 61 reacts with the polysilicon to generate metal silicide, and the metal silicide is used as the protective layer 60.

Specifically, since the metal material layer 61 directly covers the upper electrode filling layer 50, the metal material layer 61 may directly react with the upper portion of the upper electrode filling layer 50, so that the metal element reacts to the upper portion of the upper electrode filling layer 50, thereby a circumferential outer edge of the metal silicide obtained after the reaction is flush with an upper outer edge of the upper electrode filling layer 50, that is, the side wall of the protective layer 60 is flush with the upper side wall of the upper electrode filling layer 50, so that when the material layer is removed downwards along the side wall of the protective layer 60, two sides of the removed material layer may be symmetrical, therefore the problem that one side of the upper electrode filling layer 50 is too long may not occur.

In an embodiment, cobalt (Co) and polysilicon (poly) are reacted by annealing (Anneal) to generate a cobalt-silicon compound (CoSix) wrapped on the capacitor structure.

It should be noted that the upper portion of the upper electrode filling layer 50 is covered with the metal material layer 61, that is, when the polysilicon reacts with the metal material layer 61, in the case that the thickness of the metal material layer 61 is sufficient, the thickness of the finally obtained metal compound is basically the same. Therefore, after the protective layer 60 is formed, even if a thickness of the side wall of the protective layer 60 is increased relative to that of the upper side wall of the upper electrode filling layer 50, the increased thickness on the opposite sides may be basically the same. Therefore, when the material is removed downwards, it may be guaranteed that the two symmetrical sides are basically the same, and excessive asymmetry may not occur.

Compared with the related art, while the upper electrode filling layer is removed, the capacitor structure needs to be covered with the photoresist, and then the upper electrode filling layer without covering by photoresist between the capacitor structures is removed by dry etching. However, if the yellow light alignment is offset, it may cause the asymmetrical coverage of the photoresist around the capacitor structure, thereby causing that a retention section of the upper electrode filling layer on one side is too long and easily connected with the contact hole (i.e., the plug 91) in a rear section, so as to cause the short circuit between the contact holes. However, in the present embodiment, the cobalt-silicon compound is generated through the reaction of cobalt and polysilicon, the photoetching technology is avoided from being used, that is, the problem that the short circuit is caused by the excessive electrode material that is not effectively etched due to the photoresist offset in the related art is avoided.

In an embodiment, the process of forming the protective layer 60 includes the following operations. The unreacted metal material layer 61 is removed. Considering that the metal material layer 61 may not be completely reacted, the unreacted metal material layer needs to be removed to expose the protective layer 60.

In an embodiment, the unreacted metal material layer 61 is removed by acid washing.

In an embodiment, the process of forming the capacitor structure further includes the following operations. Before the metal material layer 61 is formed, a spin-coated carbon layer 62 is formed on the surface of the upper electrode plate, and the surface, parallel to the substrate 10, of the upper electrode plate is exposed. The metal material layer 61 is formed on the spin-coated carbon layer 62 and covers the upper portion of the upper electrode plate.

Specifically, by forming the spin-coated carbon layer 62 on the surface of the upper electrode filling layer 50, that is, the spin-coated carbon layer 62 wraps a part of the upper electrode filling layer 50, while the metal material layer 61 covers an upper surface of the spin-coated carbon layer 62, the metal material layer 61 and the spin-coated carbon layer 62 may completely cover the upper electrode filling layer 50, therefore the metal material layer 61 may be fully reacted with the upper portion of the upper electrode filling layer 50, thereby forming the protective layer 60 covering the upper portion of the upper electrode filling layer 50. It may be understood as that the metal element enters the upper portion of the original upper electrode filling layer 50, and thereby the upper portion of the original upper electrode filling layer 50 is reacted into the metal silicide, that is, the protective layer 60 is formed.

In an embodiment, an outer side surface of the upper electrode filling layer 50 has a concave-convex side structure, and the spin-coated carbon layer 62 fills a gap of the concave-convex side structure.

In an embodiment, after the protective layer 60 is formed, the spin-coated carbon layer 62 is removed, and the protective layer 60 is used as a mask for etching downwards to remove the upper electrode plate and the dielectric layer 30 located in portions outside the side wall of the protective layer, that is, when etching is performed downwards along the side wall of the protective layer 60, the spin-coated carbon layer 62 needs to be removed firstly, thus it is guaranteed that only the portions of the upper electrode filling layer 50, the upper electrode 40 and the dielectric layer 30 located above the contact portion 12 in the peripheral area are etched.

In an embodiment, the filled spin-on carbon layer 62 (SOC) is burned off by an Asher.

In an embodiment, the upper electrode filling layer 50, the upper electrode 40 and the dielectric layer 30 between the capacitor structures (multiple capacitor structures may be formed on one substrate 10) are removed by dry etching along the side wall of the capacitor structure (i.e., the side wall of the protective layer 60).

In an embodiment, the method for manufacturing the semiconductor structure further includes the following operations. An oxide layer 90 is formed on the substrate 10, and the oxide layer 90 covers surfaces of the upper electrode plate and the protective layer 60.

Specifically, the oxide layer 90 is formed on the substrate 10, the oxide layer 90 covers surfaces of the upper electrode filling layer 50 and the protective layer 60, and fills a gap in the concave-convex side structure of the upper electrode filling layer 50, so as to guarantee that the capacitor structure is covered with the oxide layer 90.

In an embodiment, the material of the oxide layer 90 includes, but is not limited to, silicon oxide. After the oxide layer 90 is formed, planarization treatment needs to be performed.

In an embodiment, the method for manufacturing the semiconductor structure further includes the following operations. The plug 91 is formed on the substrate 10, the plug 91 is spaced apart from the upper electrode plate and directly connected with the contact portion 12 in the peripheral area, that is, after the capacitor structure is formed, and the upper electrode plate and the dielectric layer 30 covering the contact portion 12 in the peripheral area are removed, the plug 91 is formed in the peripheral area.

In an embodiment, the method for manufacturing the semiconductor structure further includes the following operations. A capacitance contact plug 92 is formed on the substrate 10, and the capacitance contact plug 92 is connected with the upper electrode plate.

Further, the capacitance contact plug 92 is formed above the protective layer 60.

Specifically, the method for manufacturing the semiconductor structure in the present embodiment includes the following operations.

As shown in FIG. 2, the capacitor structure is formed on the substrate 10, and the dielectric layer 30 and the upper electrode plate of the capacitor structure cover the contact portion 12 in the peripheral area. The spin-coated carbon layer 62 is filled between the capacitor structures, and the spin-coated carbon layer 62 exposes the upper portion of the upper electrode filling layer 50. Optionally, an embodiment in which the spin-coated carbon layer 62 is flush with the upper surface of the upper electrode filling layer 50 is not excluded.

Figure 3:
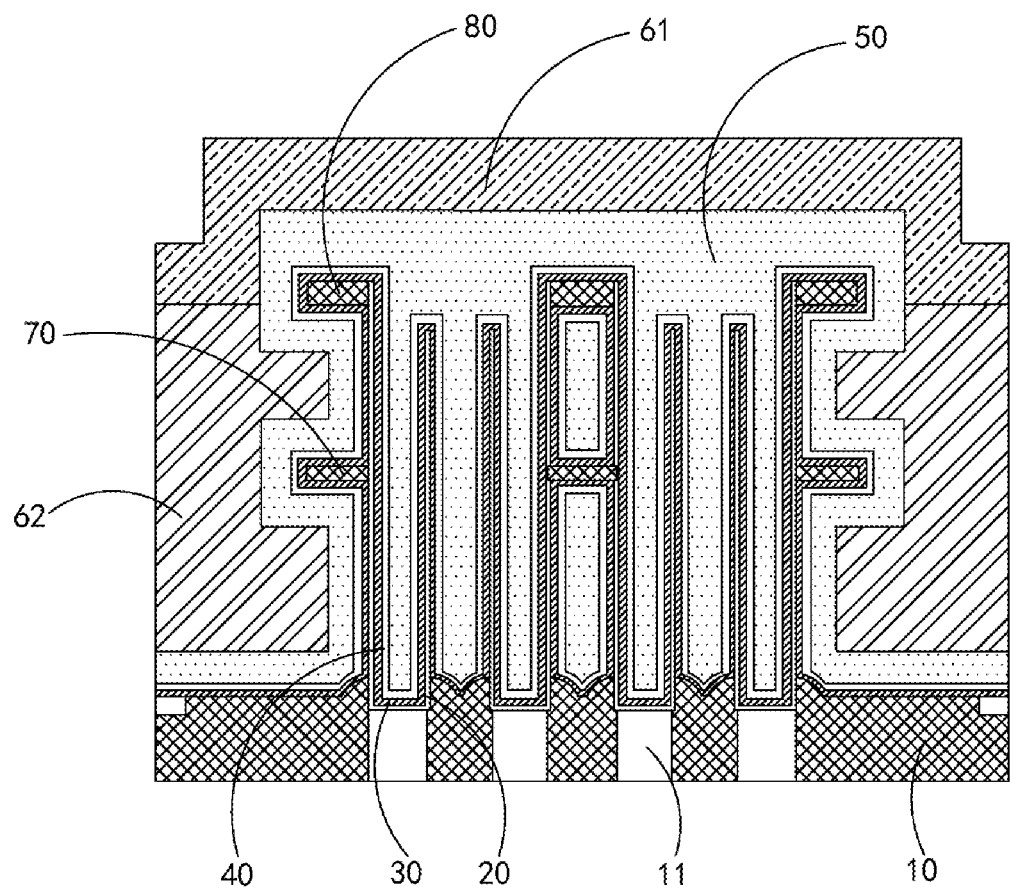
FIG. 3 is a structure schematic diagram in which a metal material layer is formed by a method for manufacturing a semiconductor structure shown according to an exemplary embodiment.

On the basis of FIG. 2, the metal material layer 61 is formed on the spin-coated carbon layer 62 and the upper portion of the upper electrode filling layer 50. As shown in FIG. 3, the metal material layer 61 covers the upper portion of the upper electrode filling layer 50, similarly a groove is formed in the metal material layer 61, and the upper portion of the upper electrode filling layer 50 is located in the groove.

Figure 4:
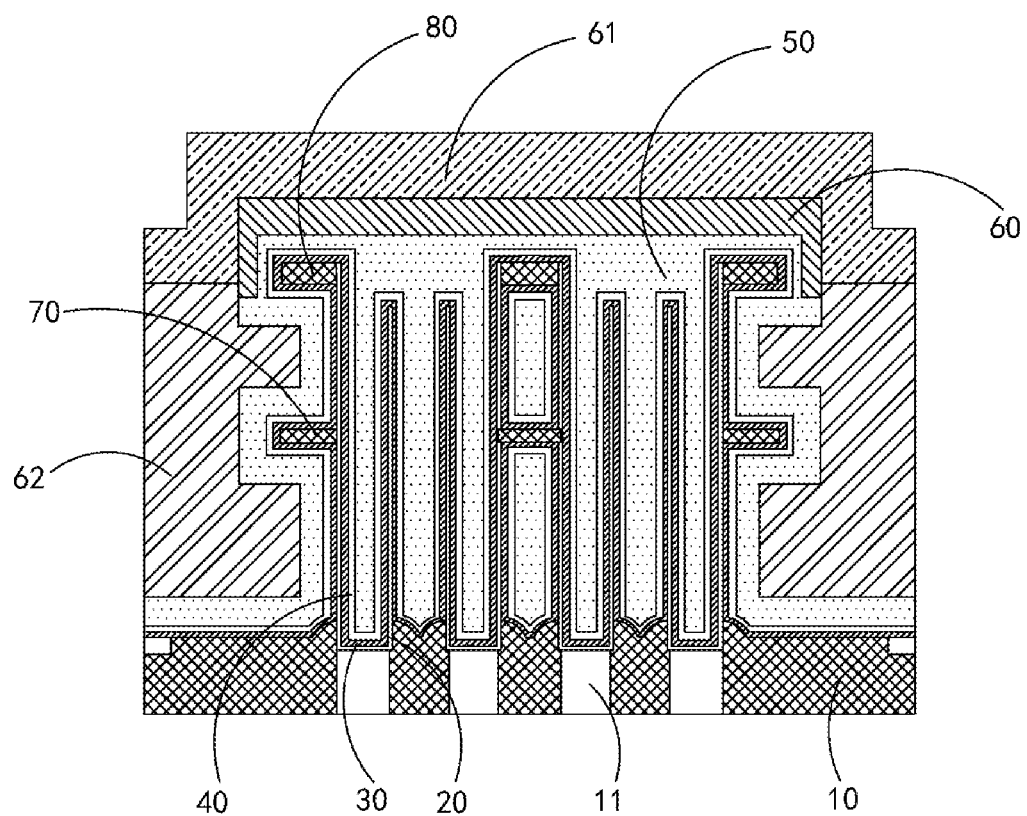
FIG. 4 is a structure schematic diagram in which a protective layer is formed by a method for manufacturing a semiconductor structure shown according to an exemplary embodiment.

On the basis of FIG. 3, the metal material layer 61 is enabled to react with the upper electrode filling layer 50 to form the protective layer 60. As shown in FIG. 4, a part of the metal material layer 61 is not fully reacted.

Figure 5:
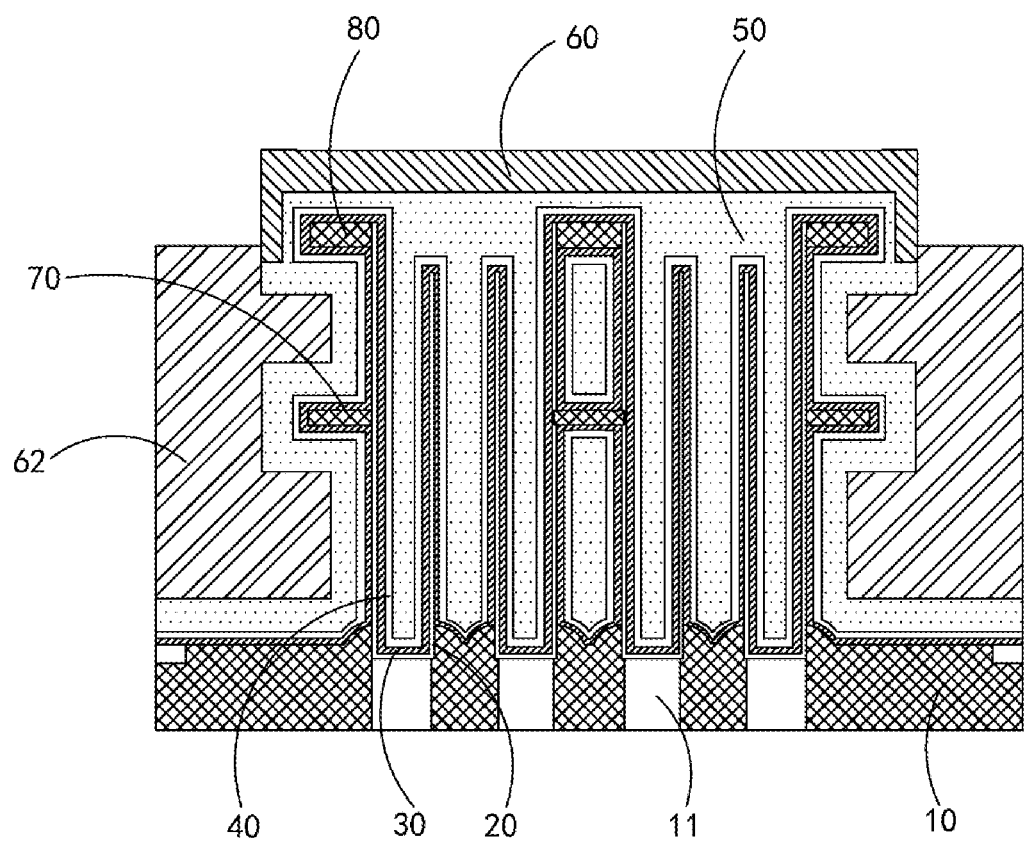
FIG. 5 is a structure schematic diagram in which a metal material layer is removed by a method for manufacturing a semiconductor structure shown according to an exemplary embodiment.

On the basis of FIG. 4, the unreacted metal material layer 61 is removed to form the structure shown in FIG. 5, that is, the protective layer 60 is formed on the upper portion of the upper electrode filling layer 50, and the protective layer 60 covers the upper portion of the upper electrode filling layer 50.

Figure 6:
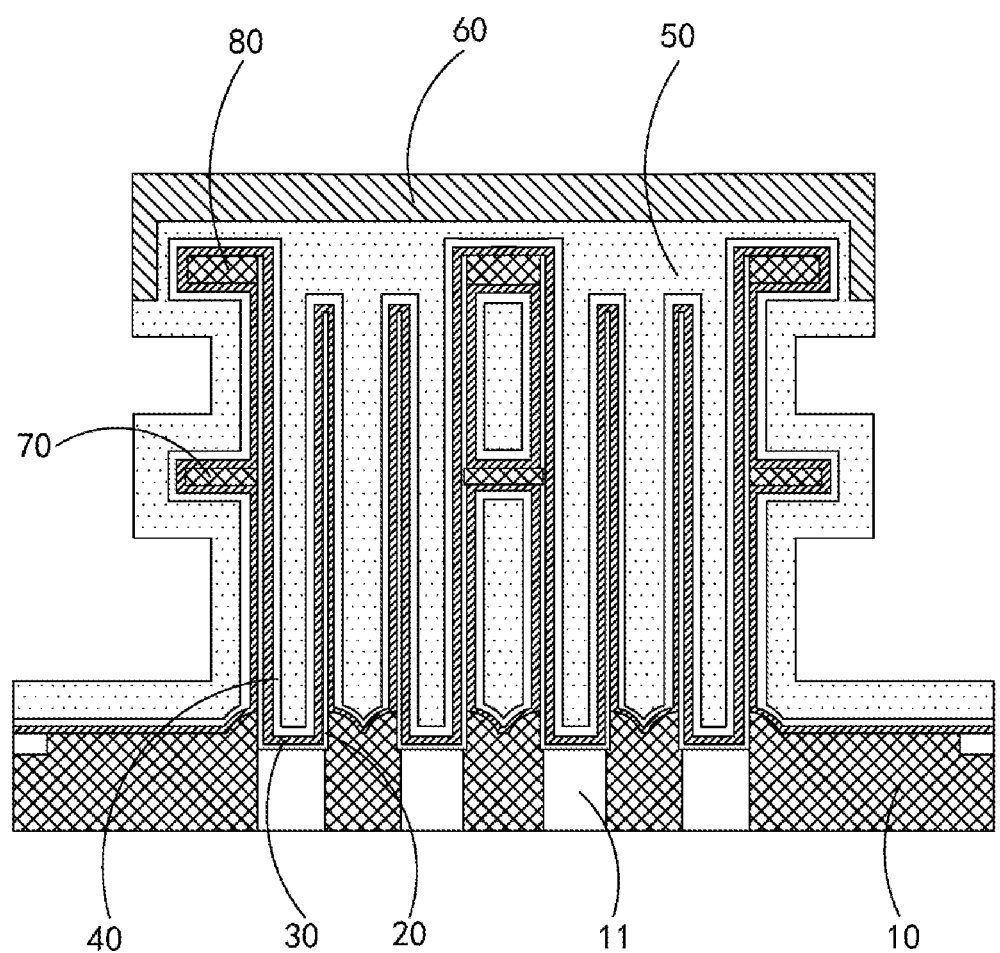
FIG. 6 is a structure schematic diagram of a spin-coated carbon layer is removed by a method for manufacturing a semiconductor structure shown according to an exemplary embodiment.

On the basis of FIG. 5, the spin-coated carbon layer 62 is removed to form the structure shown in FIG. 6, that is, the surface of the upper electrode filling layer 50 is exposed.

Figure 7:
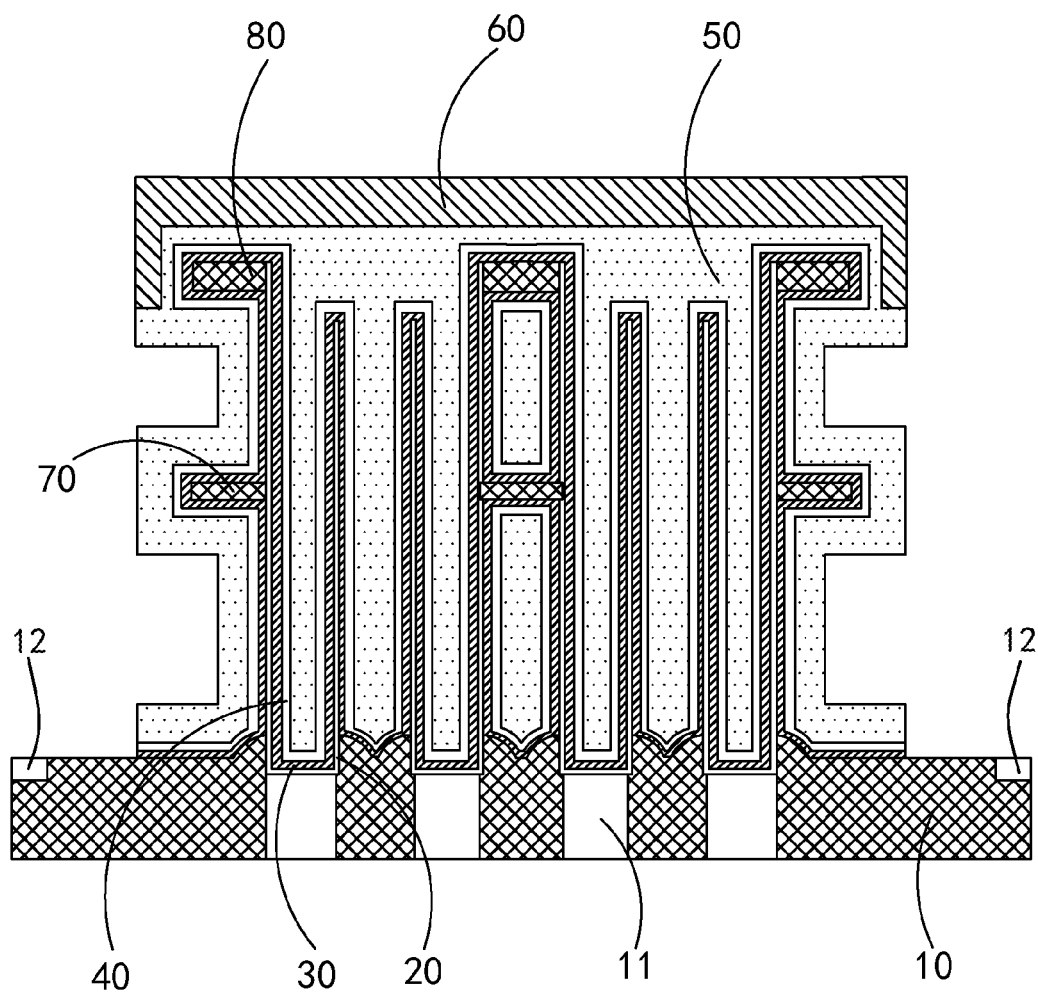
FIG. 7 is a structure schematic diagram in which portions of an upper electrode plate and a dielectric layer are removed by a method for manufacturing a semiconductor structure shown according to an exemplary embodiment.

On the basis of FIG. 6, it is etched downwards along the side wall of the protective layer 60, that is, the protective layer 60 is used as a mask, and the portions of the upper electrode filling layer 50, the upper electrode 40 and the dielectric layer 30 covering the contact portion 12 are removed to expose the contact portion 12, so that the structure shown in FIG. 7 is formed.

Figure 8:
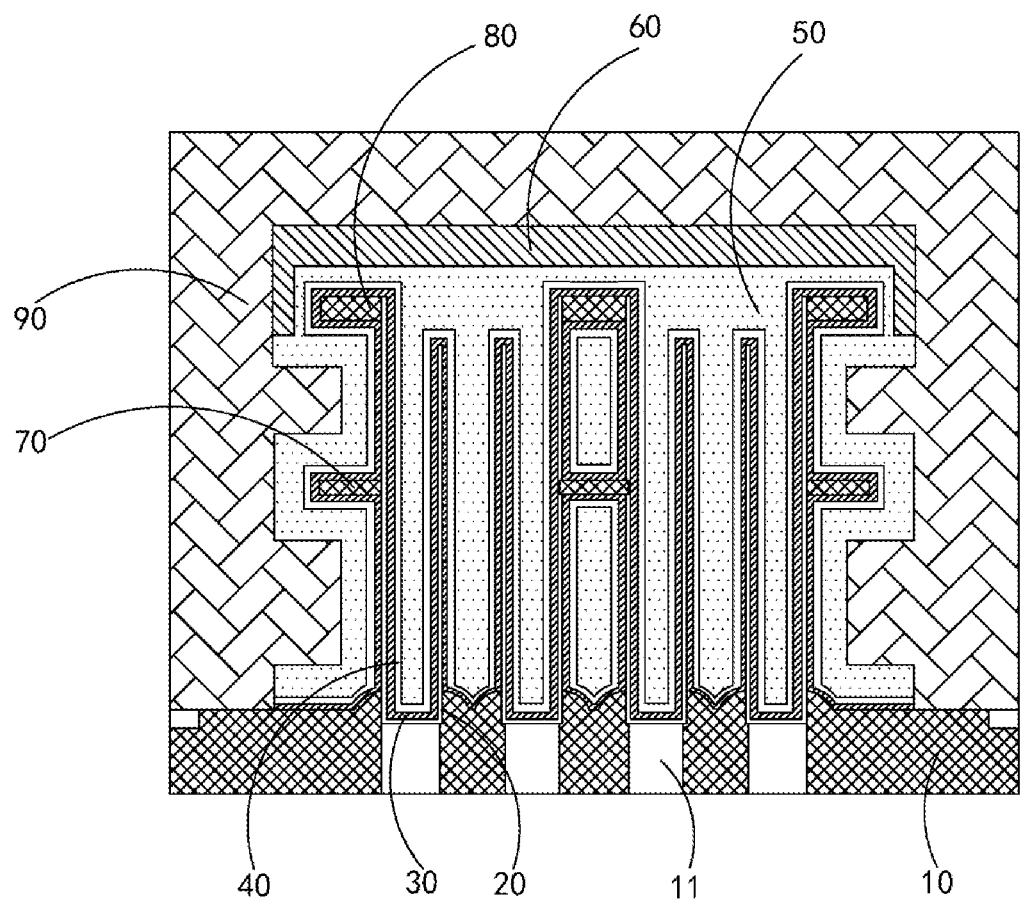
FIG. 8 is a structure schematic diagram in which an oxide layer is formed by a method for manufacturing a semiconductor structure shown according to an exemplary embodiment.

On the basis of FIG. 7, the oxide layer 90 is filled, so that the capacitor structure is buried in the oxide layer 90, as shown in FIG. 8 specifically.

Figure 9:
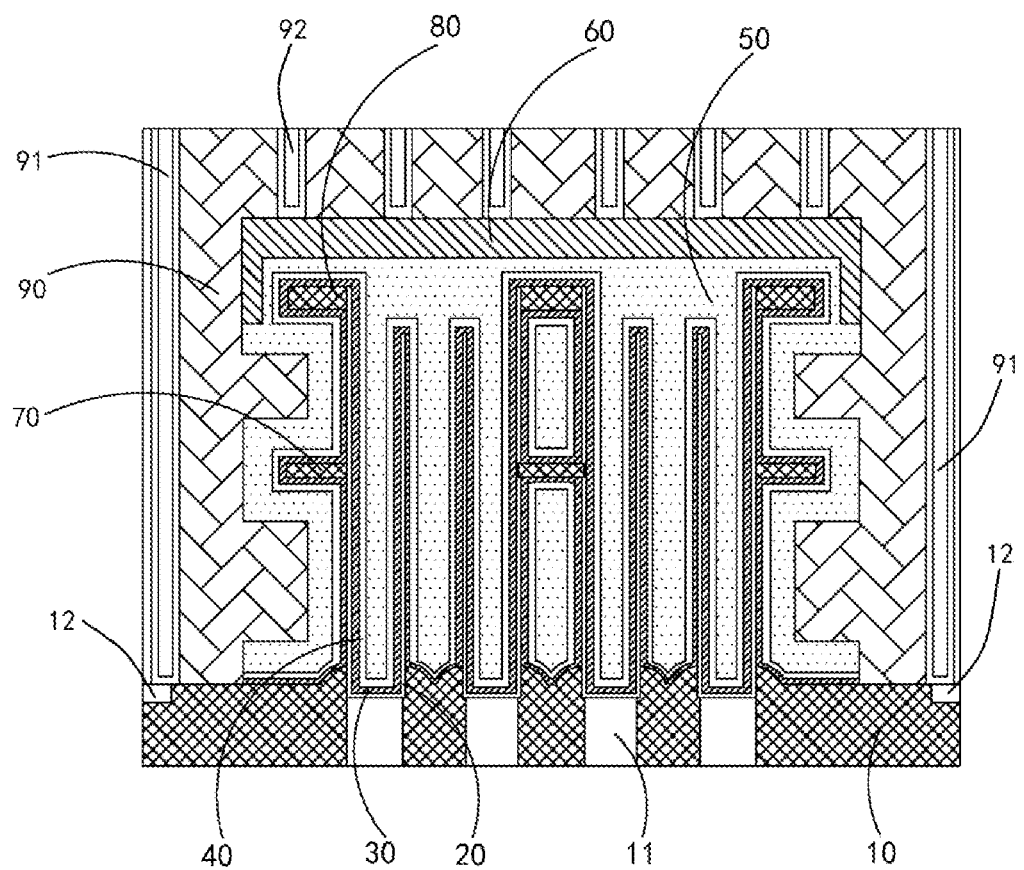
FIG. 9 is a structure schematic diagram of a semiconductor structure shown according to an exemplary embodiment.

On the basis of FIG. 8, the capacitance contact plug 92 as shown in FIG. 9 is formed on a top of the capacitor structure, and the plug 91 is formed in the peripheral area. The plug 91 is connected with the contact portion 12.

In the method for manufacturing the semiconductor structure according to the present embodiment, the metal silicide is generated through the reaction of the metal element and polysilicon, the photoetching process is avoided, thereby avoiding the problem that the electrode material of the contact portion 12 in the peripheral area is not effectively cut off.

An embodiment of the present disclosure further provides a semiconductor structure. Referring to FIG. 9, the semiconductor structure includes a substrate 10 in which a capacitor structure is formed, and the capacitor structure includes a lower electrode plate 20, a dielectric layer 30, an upper electrode plate and a protective layer 60. The lower electrode plate 20 is located on the substrate 10. The dielectric layer 30 covers a surface of the lower electrode plate 20. The upper electrode plate covers the dielectric layer 30. The protective layer 60 is formed on a surface, parallel to the substrate 10, of the upper electrode plate.

The semiconductor structure of an embodiment of the present disclosure includes the substrate 10 and the capacitor structure, and the capacitor structure includes the lower electrode plate 20, the dielectric layer 30, the upper electrode plate and the protective layer 60. By forming the protective layer 60 on the upper surface of the upper electrode plate, the resistance performance of the capacitor structure may be improved, thereby improving the service performance of the semiconductor structure.

In an embodiment, a side wall of the protective layer 60 is flush with a side wall, with a largest cross-sectional area, of the upper electrode plate, that is, the protective layer 60 is arranged to guarantee that the problem of one side of the upper electrode plate being too long does not occur, thereby improving the performance of the semiconductor structure.

It should be noted that when the plug 91 is formed in the semiconductor structure, if one side of the upper electrode plate is too long, that is, the contact portion 12 in the peripheral area is not exposed, a phenomenon that the plug 91 is directly connected to the upper electrode plate of which one side is too long may occur, thereby the plug 91 is not connected with the corresponding contact portion 12 but connected with an electrode material of the capacitor structure. In such case, the short circuit problem is caused and the normal use of the semiconductor structure is affected. Therefore, the protective layer 60 in the present embodiment may avoid the above problems, that is, after the protective layer 60 is formed, the upper electrode plate located in the peripheral area may be removed downwards along the side wall of the protective layer 60, thereby the contact portion 12 is reliably exposed, and the side wall of the protective layer 60 is enabled to be flush with the side wall, with the largest cross-sectional area, of the upper electrode plate, that is, the protective layer 60 is arranged to guarantee that the problem of one side of the upper electrode plate being too long does not occur, that is, the contact portion 12 subsequently connected to the plug 91 can be reliably exposed.

In an embodiment, a side wall of the protective layer 60 is flush with a side wall of the bottom of the upper electrode plate, that is, after the protective layer 60 is formed, a part of a section body of the bottom of the upper electrode plate may be removed by etching downwards along the side wall of the protective layer 60, and it may be guaranteed that lengths of the removed portions of two opposite sides of the upper electrode plate are basically the same, so that the contact portion 12 in the peripheral area may be reliably exposed.

In an embodiment, a side wall at the bottom of the upper electrode 40 and a side wall at the bottom of the dielectric layer 30 are flush with the side wall at the bottom of the upper electrode plate, that is, in a process of removing the section body at the bottom of the upper electrode plate, the section bodies at the bottoms of the upper electrode 40 and the dielectric layer 30 are also removed.

It should be noted that the bottom herein refers to a portion close to the substrate 10, for example, the bottom of the dielectric layer 30 is a portion of the dielectric layer 30 that directly contacts with the substrate 10.

In an embodiment, the side wall of the protective layer 60 is flush with a side wall, connected with the protective layer 60, of the upper electrode plate, that is, a circumferential outer edge, connected to the protective layer 60, of the upper electrode plate is coincided with a vertical projection of a circumferential outer edge of the protective layer 60 on the substrate 10, thus in a subsequent process, when etching is performed downwards along the side wall of the protective layer 60, it is equivalent to etching downwards along the side wall of the upper portion of the upper electrode plate, it is guaranteed that etching amounts at two opposite sides are basically the same, so as to avoid a problem that the contact portion 12 in the peripheral area is not exposed.

In an embodiment, a groove is formed in the protective layer 60, and the upper portion of the upper electrode plate is located in the groove, that is, the upper portion of the upper electrode plate is covered with the protective layer 60. The groove herein is merely explained in terms of structure, which means that the upper portion of the upper electrode plate is covered with the protective layer 60, as shown in FIG. 9.

In an embodiment, the protective layer 60 includes metal silicide, and the metal silicide may improve the resistance performance of the semiconductor structure.

In an embodiment, the protective layer 60 has a doping element, and the doping element reacts with the upper electrode plate to generate the protective layer 60, so as to guarantee that the circumferential outer edge of the protective layer 60 does not deviate from a center position of the original capacitor structure, so that it is guaranteed that when it is etched downwards along the side wall of the protective layer 60 in the subsequent process, the etching amounts at two opposite sides are basically the same, thereby avoiding a problem that the retained length of one side of the upper electrode plate is too long.

In an embodiment, the upper electrode plate includes polysilicon, and the doping element includes at least one of nickel, cobalt, titanium, copper, molybdenum, tantalum or tungsten, that is, the polysilicon reacts with the doping element to generate metal silicide.

It should be noted that a high-temperature refractory metal, a transition metal, a precious metal or a rare earth metal may all be used as the doping element.

In an embodiment, as shown in FIG. 9, the upper electrode plate includes an upper electrode 40 and an upper electrode filling layer 50, the upper electrode 40 covers the surface of the dielectric layer 30, the upper electrode filling layer 50 covers the upper electrode 40, and the protective layer covers the upper electrode filling layer 50.

In an embodiment, the upper electrode filling layer 50 is polysilicon, and the doping element reacts with the upper electrode filling layer 50 to generate the metal silicide.

In an embodiment, as shown in FIG. 9, the substrate 10 includes a contact pad 11, and the lower electrode plate 20 directly contacts with the contact pad 11, so as to guarantee an electrical connection between the lower electrode plate 20 and the contact pad 11.

Optionally, the substrate 10 includes multiple discrete contact pads 11, and multiple discrete lower electrode plates 20 directly contact with the multiple discrete contact pads 11 respectively.

Specifically, the material of the contact pad 11 includes, but is not limited to, tungsten.

In an embodiment, as shown in FIG. 9, there are multiple lower electrode plates 20, and the multiple lower electrode plates 20 are separated on the substrate 10. The semiconductor structure further includes a first support layer 70 and a second support layer 80. The first support layer 70 is located in a middle of the lower electrode plate 20 and separates the lower electrode plate 20. The second support layer 80 is located on the upper portion of the lower electrode plate 20 and separates the lower electrode plate 20.

Specifically, as shown in FIG. 9, the first support layer 70 and the second support layer 80 are sequentially arranged along a height direction, and the first support layer 70 and the second support layer 80 are arranged at intervals. The first support layer 70 and the second support layer 80 achieve the supporting function for the lower electrode plate 20 and the upper electrode 40.

Optionally, the first support layer 70 and the second support layer 80 may be made of the same material. Certainly, the first support layer 70 and the second support layer 80 may also be made of different materials. Specifically, the first support layer 70 and the second support layer 80 may both include silicon nitride.

01 Optionally, the substrate 10 may include a silicon nitride layer, that is, the capacitor structure is directly arranged on the silicon nitride layer.

Optionally, the dielectric layer 30 is arranged between the lower electrode plate 20 and the upper electrode 40, and the material of the dielectric layer 30 includes a high-k material. The high-k material includes, but is not limited to, the high-k material such as aluminum oxide, zirconium oxide and hafnium oxide or any combinations thereof.

Optionally, the material of the lower electrode plate 20 includes, but is not limited to, titanium nitride.

Optionally, the material of the upper electrode 40 includes, but is not limited to, titanium nitride.

In an embodiment, as shown in FIG. 9, an outer side surface of the upper electrode filling layer 50 has a concave-convex side structure. The semiconductor structure further includes an oxide layer 90, the oxide layer 90 covers surfaces of the upper electrode filling layer 50 and the protective layer 60, and fills a gap in the concave-convex side structure, so as to guarantee that the capacitor structure is covered with the oxide layer 90.

In an embodiment, as shown in FIG. 9, the semiconductor structure further includes plugs 91. Each plug 91 is located on the substrate 10 and spaced apart from the upper electrode filling layer 50. The plug 91 is located on a side of the capacitor structure, that is, located in the peripheral area and directly connected with the contact portion 12 in the peripheral area. Due to the existence of the protective layer 60, a situation that the plug 91 is connected with the upper electrode filling layer 50 may not occur.

In an embodiment, the semiconductor structure further includes a capacitance contact plug 92, and the capacitance contact plug 92 is connected with the upper electrode plate.

Further, as shown in FIG. 9, the capacitance contact plug 92 is located above the protective layer 60.

In an embodiment, the capacitor structure is a pillar-shaped capacitor structure, a cup-shaped capacitor structure or a trench-type capacitor structure.

It should be noted that FIG. 9 shows an embodiment of the cup-shaped capacitor structure, and the pillar-shaped capacitor structure and the trench-type capacitor structure are not limited herein, and may be similar to a known structure in the related art. The present embodiment focuses on the protective layer 60 formed on the upper electrode plate.

In an embodiment, the semiconductor structure may be manufactured by the above method for manufacturing the semiconductor structure.

A person skilled in the art may easily think of other implementation of the present disclosure after considering the specification and practicing the invention disclosed herein. The present disclosure is intended to cover any modifications, uses or adaptations of the present invention, these modifications, uses or adaptations follow the general principles of the present disclosure and include common knowledge or conventional technical means well-known in the technical field that are not disclosed in the present disclosure. The specification and exemplary embodiments are merely to be regarded as exemplary, and the true scope and spirit of the present disclosure are indicated by the preceding claims.

It should be understood that the present disclosure is not limited to the precise structure already described above and shown in the drawings, and various modifications and changes may be made without departing from a scope thereof. The scope of the present disclosure is merely limited by the appended claims.

The invention claimed is:

1. A semiconductor structure, comprising:
   a substrate in which a capacitor structure is formed, the capacitor structure comprising:
   a lower electrode plate located on the substrate;
   a dielectric layer covering a surface of the lower electrode plate;
   an upper electrode plate covering the dielectric layer; and
   a protective layer formed on a surface, parallel to the substrate, of the upper electrode plate, wherein the protective layer has a doping element, and the doping element reacts with the upper electrode plate to generate the protective layer.

2. The semiconductor structure of claim 1, wherein the protective layer comprises metal silicide.

3. The semiconductor structure of claim 1, wherein the upper electrode plate comprises polysilicon, and the doping element comprises at least one of nickel, cobalt, titanium, copper, molybdenum, tantalum or tungsten.

4. The semiconductor structure of claim 1, wherein the upper electrode plate comprises an upper electrode and an upper electrode filling layer, the upper electrode covers a surface of the dielectric layer, and the upper electrode filling layer covers the upper electrode.

5. The semiconductor structure of claim 4, wherein the upper electrode filling layer is polysilicon.

6. The semiconductor structure of claim 4, wherein an outer side surface of the upper electrode filling layer has a concave-convex side structure, and the semiconductor structure further comprises: an oxide layer covering surfaces of the upper electrode filling layer and the protective layer.

7. The semiconductor structure of claim 4, further comprising:
   a plug located on the substrate and spaced apart from the upper electrode filling layer.

8. The semiconductor structure of claim 1, wherein the capacitor structure is a pillar-shaped capacitor structure, a cup-shaped capacitor structure or a trench-type capacitor structure.

9. The semiconductor structure of claim 1, wherein the substrate comprises a contact pad in contact with the lower electrode plate directly.

10. The semiconductor structure of claim 1, further comprising:
    a capacitance contact plug connected with the upper electrode plate.

11. A method for manufacturing a semiconductor structure, comprising:
    providing a substrate, and forming a capacitor structure in the substrate, wherein forming the capacitor structure comprises:
    forming a lower electrode plate on the substrate;
    forming a dielectric layer on a surface of the lower electrode plate;
    forming an upper electrode plate on a surface of the dielectric layer; and
    forming a protective layer on a surface, parallel to the substrate, of the upper electrode plate, wherein a doping element reacts with the upper electrode plate to generate the protective layer.

12. The method for manufacturing the semiconductor structure of claim 11, wherein generating the protective layer comprises:
    performing ion doping on an outer surface of the upper electrode plate and then performing annealing on the doped outer surface to generate the protective layer.

13. The method for manufacturing the semiconductor structure of claim 11, wherein generating the protective layer comprises:
    forming a metal material layer on the upper electrode plate; and
    enabling the metal material layer to react with the upper electrode plate to generate the protective layer.

14. The method for manufacturing the semiconductor structure of claim 13, wherein forming the capacitor structure further comprises: before the metal material layer is formed,
    forming a spin-coated carbon layer on a surface of the upper electrode plate, and exposing the surface of the upper electrode plate parallel to the substrate,
    wherein the metal material layer is formed on the spin-coated carbon layer and covers an upper portion of the upper electrode plate.

15. The method for manufacturing the semiconductor structure of claim 14, wherein after the protective layer is formed, the spin-coated carbon layer is removed, and the protective layer is used as a mask for etching downwards to remove the upper electrode plate and the dielectric layer located outside a side wall of the protective layer.

16. The method for manufacturing the semiconductor structure of claim 11, wherein forming the capacitor structure further comprises:
    removing the upper electrode plate located outside a side wall of the protective layer downwards along the side wall of the protective layer.

17. The method for manufacturing the semiconductor structure of claim 16, further comprising:
    forming a capacitance contact plug on the substrate, the capacitance contact plug being connected with the upper electrode plate.

18. The method for manufacturing the semiconductor structure of claim 11, further comprising:
    forming a plug on the substrate, the plug being spaced apart from the upper electrode plate.

* * * * *